(12) United States Patent
Lee et al.

(10) Patent No.: US 6,339,230 B1
(45) Date of Patent: Jan. 15, 2002

(54) METHOD FOR MANUFACTURING A LIQUID CRYSTAL DISPLAY

(75) Inventors: Jueng-gil Lee, Kyungkido; Jung-ho Lee; Hyo-rak Nam, both of Kyungki-do, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/391,454

(22) Filed: Sep. 8, 1999

Related U.S. Application Data

(63) Continuation of application No. 08/754,644, filed on Nov. 21, 1996, now Pat. No. 6,008,065.

(30) Foreign Application Priority Data

Nov. 21, 1995 (KR) .............................. 95-42618
Apr. 30, 1996 (KR) .............................. 96-13912

(51) Int. Cl.$^7$ .............................................. H01L 21/84
(52) U.S. Cl. .......................... 257/88; 257/347; 257/59
(58) Field of Search ........................ 257/59, 72, 79–83, 257/347

(56) References Cited

U.S. PATENT DOCUMENTS 5,032,531 A * 7/1991 Tsutsui et al.
5,075,244 A * 12/1991 Sakai et al.
5,334,859 A * 8/1994 Matsuda ...................... 257/66
5,621,556 A * 4/1997 Fulks et al. ................... 349/42

* cited by examiner

Primary Examiner—Jey Tsai
(74) Attorney, Agent, or Firm—Volentine Francos, PLLC

(57) ABSTRACT

A method for manufacturing a liquid crystal display is provided. The method includes the steps of forming a gate electrode and a gate pad by sequentially depositing a first metal film and a second metal film on a substrate of a TFT area and a pad area, respectively, by a first photolithography process, forming an insulating film on the entire surface of the substrate on which the gate electrode and the gate pad are formed, forming a semiconductor film pattern on the insulating film of the TFT area using a second photolithography process, forming a source electrode and a drain electrode composed of a third metal film in the TFT area using a third photolithography process, forming a protection film pattern which exposes a portion of the drain electrode and a portion of the gate pad on the substrate on which the source electrode and the drain electrode are formed using a fourth photolithography process, and forming a pixel electrode connected to the drain electrode and the gate pad on the substrate on which the protection film pattern is formed using a fifth photolithography process. By using this method it is possible to reduce the number of photolithography steps required for manufacture and to prevent a battery effect and generation of a hillock in the resulting structure.

23 Claims, 9 Drawing Sheets

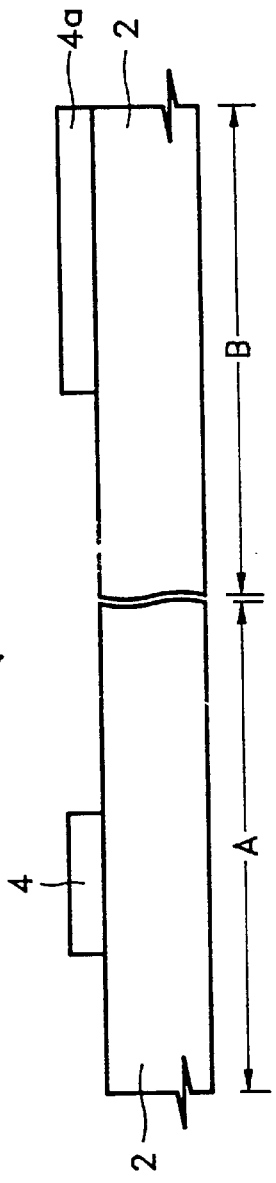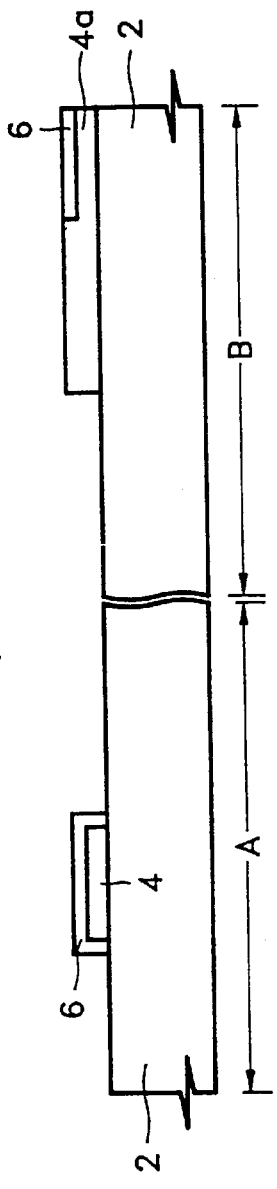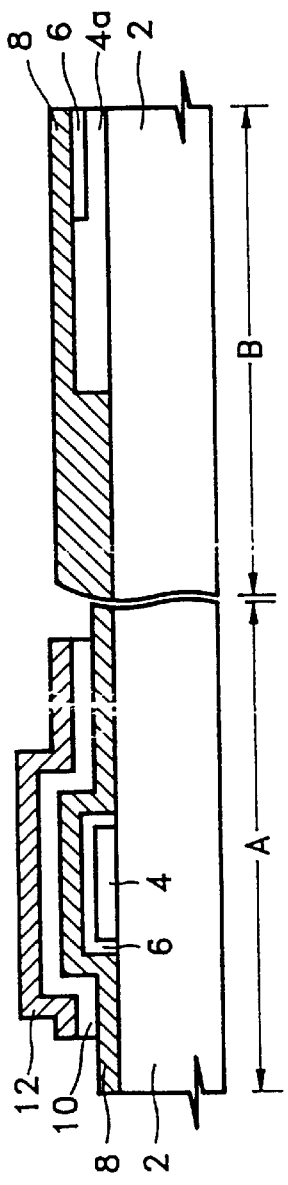

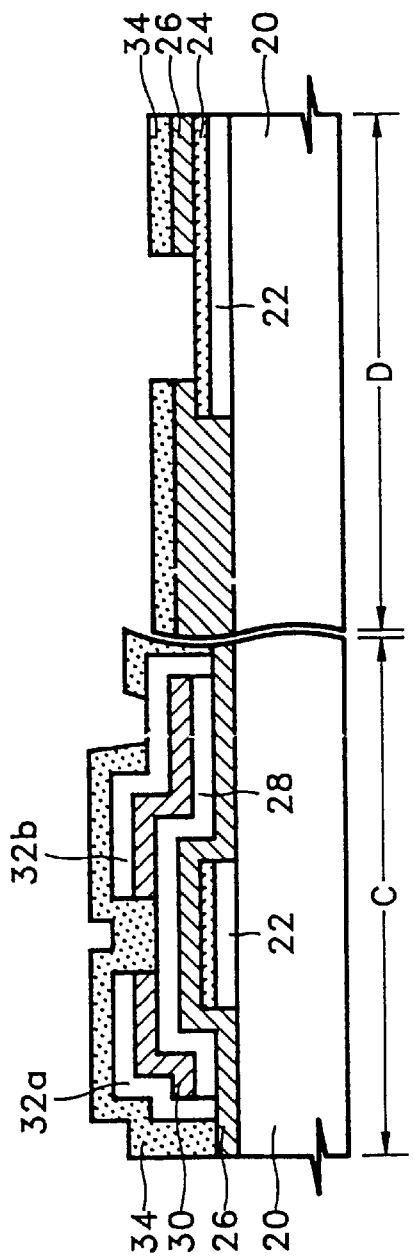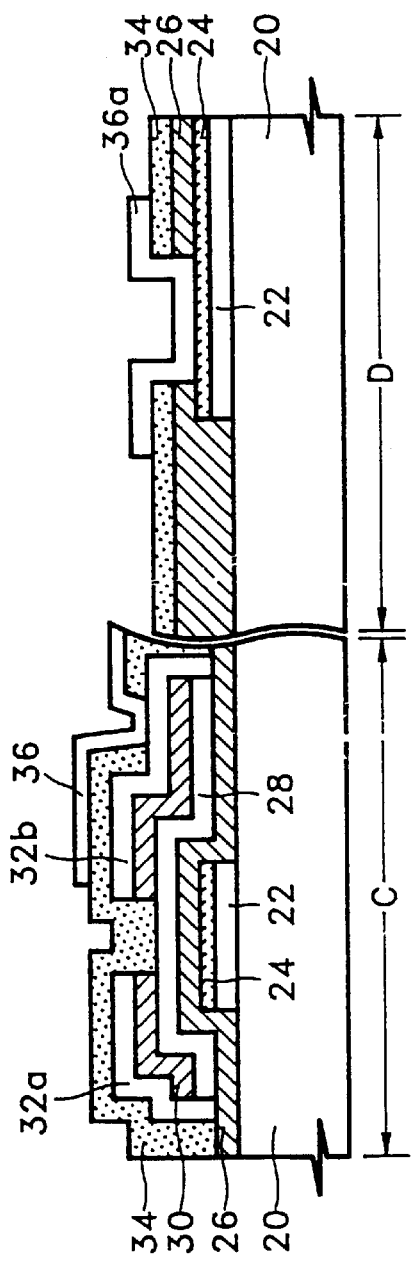

METHOD FOR MANUFACTURING A LIQUID CRYSTAL DISPLAY

CROSS REFERENCE TO RELATED APPLICATIONS

This is a continuation of application Ser. No. 08/754,644, filed Nov. 21, 1996, U.S. Pat. No. 6,008,065.

BACKGROUND OF THE INVENTION

The present invention relates to a method for manufacturing a liquid crystal display. More particularly, present invention relates to an improved method for manufacturing a thin s film transistor-liquid crystal display which reduces the number of photolithography processes that must be performed.

A thin film transistor LCD ("TFT-LCD"), which uses the thin film transistor as the active device, has various advantages over other LCDs. These advantages include low power consumption, low drive voltage, a thinness, and lightness of weight, among others.

Since the thin film transistor ("TFT") is significantly thinner than a conventional transistor, the process of manufacturing a TFT is complicated, resulting in low productivity and high manufacturing costs. In particular, since a mask is used in every step for manufacturing a TFT, at least seven masks are required. Therefore, various methods for increasing productivity of the TFT and lowering the manufacturing costs have been studied. In particular, a method for reducing the number of the masks used during the manufacturing process has been widely researched.

FIGS. 1 to 5 are sectional views for explaining a conventional method for manufacturing an LCD, as disclosed in U.S. Pat. No. 5,054,887.

In the drawings, reference characters "A" and "B" denote a TFT area and a pad area, respectively. Referring to FIG. 1, after forming a first metal film by depositing pure Al on a transparent substrate 2, gate patterns 4 and 4a are formed out of the first metal film by performing a first photolithography on the first metal film. The gate patterns are then used as a gate electrode 4 in the TFT area and as a gate pad 4a in the pad area.

As shown in FIG. 2, after forming by general photolithography a second photoresist pattern (not shown) that covers a portion of the pad area, an anodized film 6 is formed by oxidizing the first metal film using the photoresist pattern as an anti-oxidation film. The a nodized film 6 is t hen formed on the entire surface of the gate electrode 4 formed in the TFT area, and on a portion of the gate pad 4a in the pad area.

Referring to FIG. 3, an insulating film 8 is formed by depositing a layer such as a nitride film over the anodized film 6. A semiconductor film is then formed by subsequently depositing an amorphous silicon film 10 and an amorphous silicon film 12 doped with impurities on the entire surface of the substrate 2 on which the insulating film 8 is formed. A semiconductor film pattern 10 and 12 to be used as an active portion is then formed in the TFT area by performing a third photolithography on the semiconductor film.

As shown in FIG. 4, a fourth photoresist pattern (not shown) is then formed that exposes a portion of the gate pad 4a formed in the pad area by performing a fourth photolithography on the entire surface of the substrate 2 on which the semiconductor film pattern is formed. Then, a contact hole is then formed in the insulating film 8, which contact hole exposes a portion of the gate pad 4a. The contact hole is formed by etching the insulating film 8 using the fourth photoresist pattern as a mask. A source electrode 14a and a drain electrode 14b are then formed in the TFT area by depositing a chromium ("Cr") film on the entire surface of the substrate having the contact hole and performing a fifth photolithography on the Cr film. In the pad area, a pad electrode 14c connected to the gate pad 4a through the contact hole is formed. At this time, the impurity doped-amorphous silicon film 12 on the upper portion of the gate electrode 4 formed in the TFT area during the photolithography process is partially etched, thus exposing a portion of the amorphous silicon film 10.

Referring to FIG. 5, a protection film 16 is then formed by depositing an oxide film over the entire surface of the substrate 2 on which the source electrode 14a, the drain electrode 14b and the pad electrode 14c are formed. Then, contact holes are formed that expose a portion of the drain electrode 14b of the TFT area and a portion of the pad electrode 14c of the pad area. The contact holes are formed by performing a sixth photolithography on the protection film 16.

Subsequently, pixel electrodes 18 and 18a are formed by depositing indium tin oxide ("ITO"), a transparent conductive material, over the entire surface of the substrate, including the contact hole, and performing a seventh photolithography process on the resultant ITO film. As a result of this seventh lithography, the drain electrode 14b and the pixel electrode 18 are connected in the TFT area, and the pad electrode 14c and the pixel electrode 18a are connected in the pad area.

According to the conventional method for manufacturing the LCD, pure aluminum ("Al") is used as the gate electrode material to lower the resistance of a gate line. An anodizing process is therefore required to prevent a hillock caused by the Al. This additional anodizing step complicates the manufacturing process, reduces productivity, and increases manufacturing costs.

SUMMARY OF THE INVENTION

It is an object of the present invention to provide an improved method for manufacturing a liquid crystal display in which manufacturing costs are reduced and productivity increased by reducing the number of photolithography processes performed.

It is another object of the present invention to provide a method for manufacturing a liquid crystal display by which it is possible to prevent the deterioration of device characteristics by preventing the generation of an undercut in a gate electrode.

To achieve the above objects, there is provided an improved method for manufacturing a liquid crystal display according to the present invention, comprising the steps of forming a gate electrode and a gate pad by a first photolithography process by sequentially depositing a first metal film and a second metal film over a substrate of a TFT area and a pad area, respectively; forming an insulating film over the entire surface of the substrate on which the gate electrode and the gate pad are formed; forming a semiconductor film pattern over the insulating film of the TFT area using a second photolithography process; forming a source electrode and a drain electrode in the TFT area using a third photolithography process, the source electrode and the drain electrode comprising a third metal film; forming a protection film pattern over the substrate on which the source electrode and the drain electrode are formed using a fourth photolithography process, the protection film pattern exposing a portion of the drain electrode and a portion of the gate pad; and forming a pixel electrode over the substrate on which the protection film pattern is formed using a fifth photolithography process, the pixel electrode being connected to the drain electrode and the gate pad.

The first metal film preferably comprises one of aluminum or an aluminum alloy and the second metal film comprises a refractory metal. More specifically, the second metal film preferably comprises a metal selected from the group consisting of Cr, Ta, Mo, and Ti.

The step of forming the gate electrode includes the steps of forming the first metal film and the second metal film over a substrate in the described order; forming a photoresist pattern over a portion of the second metal film; etching the second metal film using the photoresist pattern as a mask; reflowing the photoresist pattern; etching the first metal film using the reflowed photoresist pattern as a mask; and removing the reflowed photoresist pattern. The step of reflowing the photoresist pattern may be performed in multiple steps.

The step of forming the gate electrode preferably includes the steps of forming the first metal film and the second metal film on the substrate in the described order; forming a photoresist pattern on a portion of the second metal film; etching the second metal, film by etching using the photoresist pattern as a mask; and etching the first metal film. The etching of the second metal film may be either a wet or dry etch and a step of baking the photoresist is pattern may be included after the step of etching the second metal film.

The step of forming the gate electrode preferably includes the steps of forming the first metal film and the second metal film on a substrate; forming a photoresist pattern on a portion of the second metal film; etching the second metal film using the photoresist pattern as a mask; etching the first metal film using the patterned second metal film; and re-etching the patterned second metal film. A step of baking the photoresist pattern may be included prior to the step of etching the first metal film after the step of etching the second metal film.

According to the present invention, it is possible to prevent a battery effect and a hillock caused by directly contact of Al to the ITO by forming the gate electrode in a double structure of Al or an Al alloy and a refractory metal film. Also, it is possible to omit the anodizing process and to simultaneously etch the insulating layer and the protection film due to a capping film, thus reducing the number of the photolithography processes. Also, since it is possible to form the first metal film larger than or identical to the second metal film, an undercut is not generated in the gate electrode. Therefore, it is possible to prevent the deterioration of insulation characteristics due to poor step coverage during deposition of the insulating film after forming the gate electrode.

BRIEF DESCRIPTION OF THE DRAWINGS

The above objects and advantages of the present invention will become more apparent by describing in detail a preferred embodiment thereof with reference to the attached drawings in which:

FIGS. 1 through 5 are sectional views illustrating a method for manufacturing liquid crystal display according to a conventional method;

FIGS. 7 through 11 are sectional views illustrating a method for manufacturing a liquid crystal display according to a first preferred embodiment of the present invention;

DETAILED DESCRIPTION OF THE INVENTION

Figure 4:
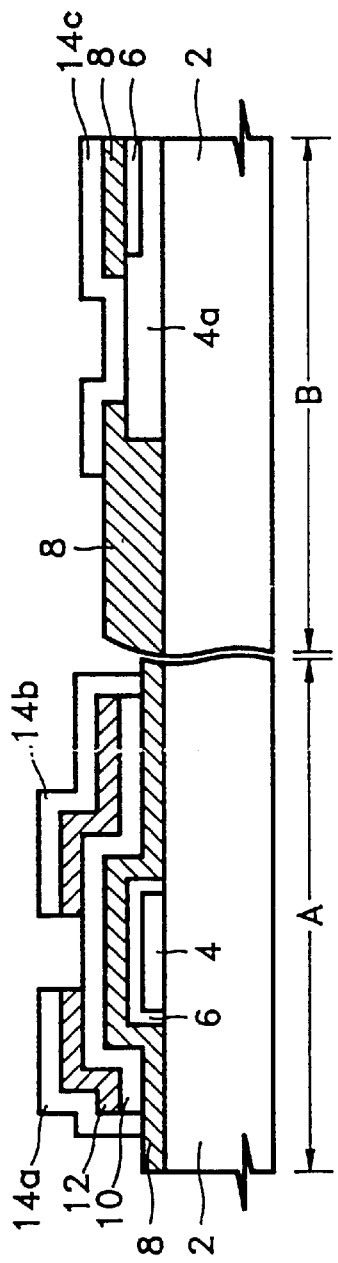
Figure 5:
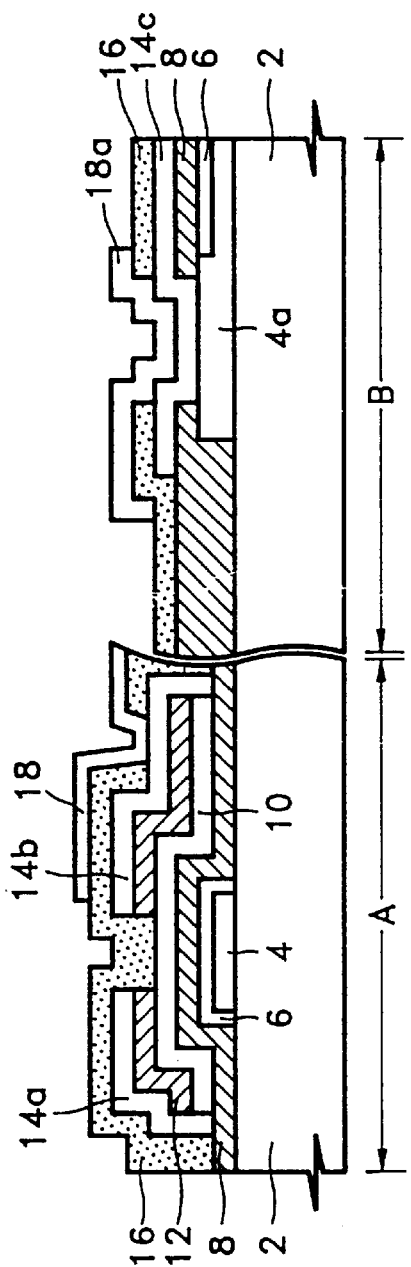
Figure 6:
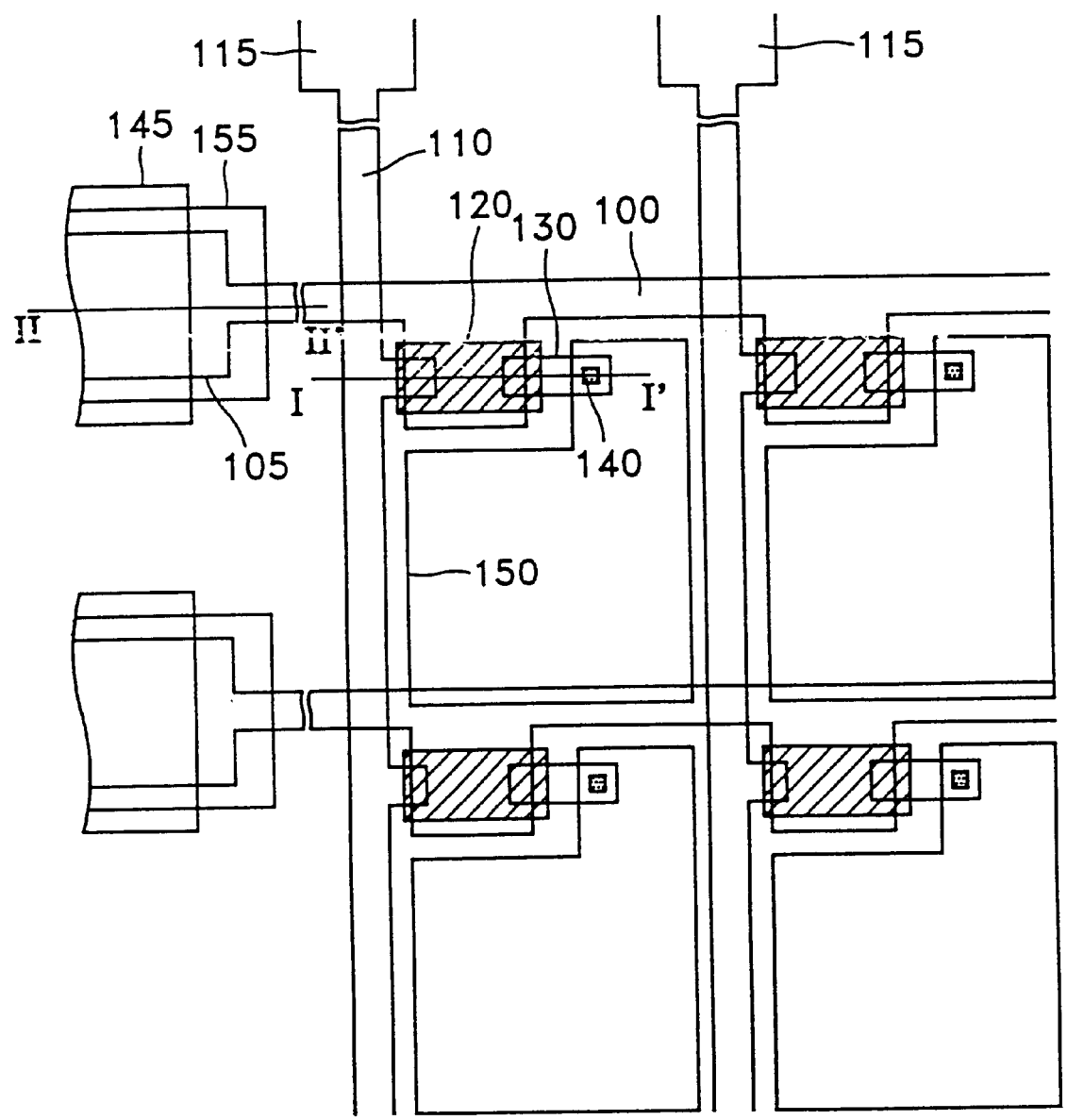
FIG. 6 is a schematic plan view of the mask patterns used for manufacturing a liquid crystal display according to first through fourth preferred embodiments of the present invention.

FIG. 6 is a schematic plan view of the mask patterns used for manufacturing a liquid crystal display according to the present invention, in which reference numeral 100 denotes a mask pattern for forming a gateline; reference numeral 105 denotes a mask pattern for forming a gate pad; reference numeral 110 denotes a mask pattern for forming a data line, reference numeral 115 denotes a mask pattern for forming a data pad; reference numeral 120 denotes a mask pattern for forming a semiconductor film; reference numeral 130 denotes a mask pattern for forming a source electrode/drain electrode; reference numeral 140 denotes a mask pattern for forming a contact hole for connecting a pixel electrode to the drain electrode in the TFT area; reference numeral 145 denotes a mask pattern for forming a contact hole for connecting a gate pad in the pad area to the pixel electrode; reference numeral 150 denotes a mask pattern for forming a pixel electrode in the TFT area; and reference numeral 155 denotes a mask pattern for forming a pixel electrode in the pad portion.

Referring to FIG. 6, the gate line 100 is arranged horizontally, and the data line 110 is arranged perpendicular to the gate line. The plurality of gate lines 100 and data lines 110 in the device are arranged together in a matrix pattern. The gate pad 105 is provided at the end portion of the gate line 100, and the data pad 115 is provided at the end portion of the data line 110. Pixel portions are respectively arranged in the matrix pattern in the portion bounded by the two adjacent gate lines and the data line. The gate electrodes of the respective TFTs are formed so as to protrude into the pixel portions from the respective gate lines. The semiconductor film 120 is formed between the drain electrodes and the gate electrodes of the respective TFTs. The source electrodes of the TFTs are formed in protruding portions from the data line 110. The pixel electrodes 150 comprise transparent ITO and are formed in the respective pixel portions.

FIGS. 7 through 11 are sectional views for explaining a method for manufacturing a liquid crystal display according to a first preferred embodiment of the present invention. Reference character "C" represents the TFT area, which is a sectional view taken along I–I' of FIG. 6, and reference character "D" represents the pad area, which is a sectional view taken along II–II' of FIG. 6.

Figure 7:
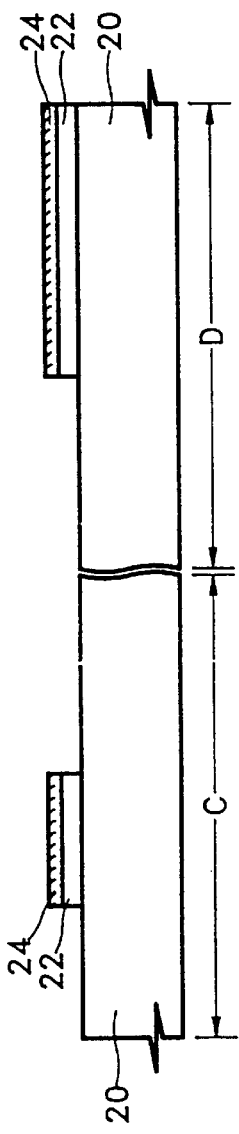

FIG. 7 shows the steps for forming the gate electrode, in which a first metal film 22 is formed by depositing an Al or an Al-alloy film to a thickness of 2,000~4,000 Å over a transparent substrate 20. A second metal film 24 is then formed by depositing a refractory metal film to a thickness 500~2,000 Å over the first metal film. Gate patterns are then formed in the TFT area and the pad area by performing a first photolithography on the first and the second metal films 22 and 24. The gate patterns are used as a gate electrode in the TFT area and as a gate pad in the pad area. The first and the second metal films are then wet or dry etched using a mask.

The first metal film 22 is preferably formed of Al or an Al-alloy such as Al—Nd or Al—Ta. It is possible to lower the resistance of the gate line and to prevent generation of a hillock when the gate electrode is formed of the Al alloy. The second metal film 24 is preferably formed of one refractory metal selected from the group consisting of Cr, Ta, Mo, and Ti. The second metal film acts as a capping film to prevent the Al alloy from contacting the ITO film to be formed in a subsequent process. Because a capping film is formed on the Al or Al-alloy, a high temperature oxidation process and a photolithography process for forming an oxidized film are not required. Also, since the second metal film 24 does not include Al, no battery effect is generated, even though the second metal film 24 directly contacts the ITO film formed in a subsequent process.

Figure 8:
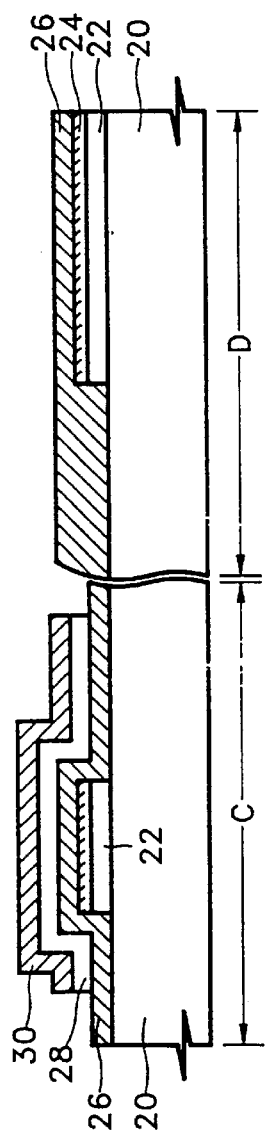

FIG. 8 shows the steps for forming a semiconductor film pattern, in which an insulating film 26 is formed by depositing a nitride film to a thickness of about 4,000 Å over the entire surface of the substrate on which a gate pattern is formed. A semiconductor film preferably comprised of an amorphous silicon film 28 and an impurity doped-amorphous silicon film 30 is formed to a thickness of 1,000~2,000 Å and a thickness of 500 Å, respectively, on the insulating layer 26. A semiconductor film patteni to be used as an active area is then formed in the TFT area by performing a second photolithography on the semiconductor film.

Figure 9:
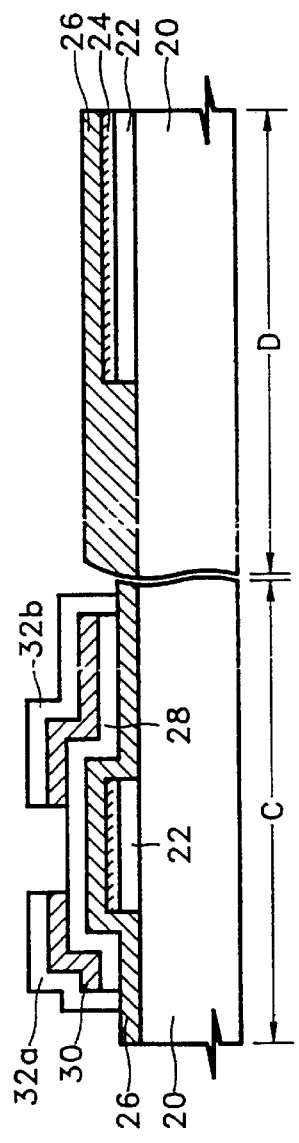

FIG. 9 shows the steps for forming a source electrode and a drain electrode. A third metal film is formed by depositing a Cr film to a thickness of 1,000~2,000 Å over the entire surface of the substrate 20 on which the semiconductor film pattern is formed. The third metal film is preferably deposited using a sputtering method. A source electrode 32a and a drain electrode 32b are then formed in the TFT area by performing a third photolithography on the third metal film.

FIG. 10 shows the steps for forming a protection film pattern. The protection film 34 is formed by depositing an insulating material ,e.g., an oxide film to a thickness of 1,000~3,000 Å over the entire surface of the substrate on which the source electrode 32a and the drain electrode 32b are formed. A protection film pattern 34 is formed by performing a fourth photolithography on the protection film. The protection film pattern 34 exposes a portion of the drain electrode 32b and a portion of the gate electrode 22 and 24 formed in the pad area, i.e., a gate pad. The protection film 34 and the insulating film 26 in the pad area over the gate pad are simultaneously etched to expose a portion of the capping film 24.

FIG. 11 shows the steps for forming a pixel electrode. After forming the ITO film, a transparent conductive film, by a sputtering method over the entire surface of the substrate on which the protection film pattern is formed, pixel electrodes 36 and 36a are formed in the TFT area and the pad area by performing a fifth photolithography on the ITO film. As a result, the pixel electrode 36 and the drain electrode 32b are connected in the TFT area and the pixel electrode 36a, and the gate pad 22 and 24 are connected in the pad area.

The method for forming a liquid crystal display according to a first embodiment of the present invention prevents the occurrence of a battery effect and prevents the formation of an Al hillock caused by contact of Al to the ITO. This method achieves these goals by forming a gate electrode using Al or an Al-alloy and by forming the capping film on the gate electrode using a refractory metal. The method of the first preferred embodiment also makes it possible to reduce the number of photolithography processes by omitting the anodizing process and simultaneously forming the contact on the insulating film and the protection film.

Figure 12:
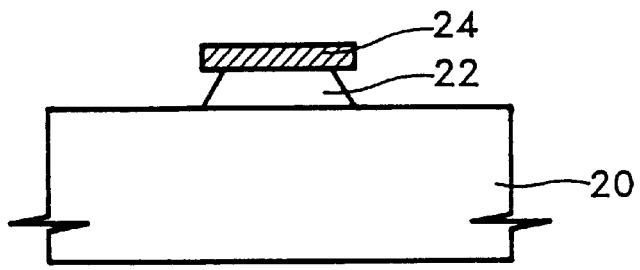
FIG. 12 is a sectional view showing generation of an undercut in a gate electrode.

The first metal film 22 and the second metal film 24 which comprise the gate electrode in the first embodiment of the present invention are etched using only one mask. As a result of this use of a single mask, an undercut may be generated in the gate electrode as shown in FIG. 12. As a result, step coverage becomes poor in a subsequent insulating film depositing process, thus creating a risk of deteriorating insulation characteristics. In the second through fourth embodiments of the present invention, a method for preventing the generation of the undercut in the gate electrode is provided.

FIGS. 13 through 16 are sectional views illustrating a method for manufacturing a liquid crystal display according to a second preferred embodiment of the present invention. The initial steps of the process, through the step of forming the gate electrode, are shown. All subsequent steps are similar to those shown for the first preferred embodiment in FIGS. 8 to 11.

Figure 13:
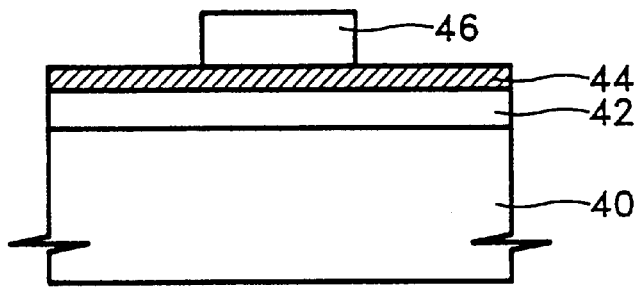
FIGS. 13 through 16 are sectional views illustrating a method for manufacturing a liquid crystal display according to a second preferred embodiment of the present invention.

FIG. 13 shows the step of forming the conductive films for the gate electrode. Initially, a first metal film 42 is formed by depositing an Al film or an Al-alloy film on a transparent substrate 40 to a thickness of 2,000~4,000 Å. A second metal film 44, used as a capping film, is then formed by depositing a refractory metal, such as Cr, Ta, Mo, or Ti, preferably Cr, over the first metal film 42. In this process, Al—Nd or Al—Ta may be used for the Al-alloy film.

Figure 14:
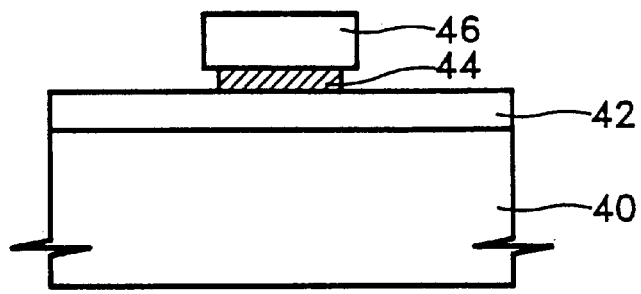

FIG. 14 shows the step of forming a photoresist pattern 46. A photoresist pattern 46 is formed by coating photoresist over the second metal film 44 and by exposing and developing the photoresist. The second metal film 44 is then etched using the photoresist pattern 46 as a mask. An undercut is generated in the second metal film 44 during this etching process by sufficiently overetching the second metal film 44.

Figure 15:
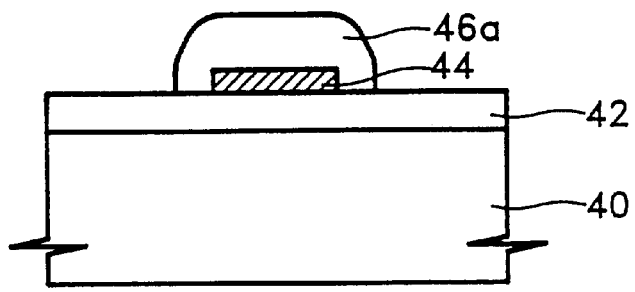

FIG. 15 shows the step of reflowing the photoresist 46. The substrate is heated to a temperature above 100° C. to reflow the photoresist 46. A multiple-step heat treatment may be performed on the substrate to improve the reflow characteristic of the photoresist 46. As a result of the reflowing process, the reflowed photoresist 46a completely covers the patterned second metal film 44.

Figure 16:
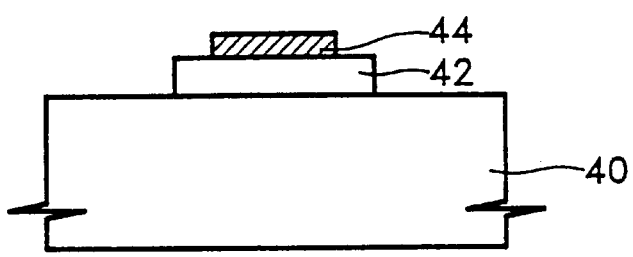

FIG. 16 shows the steps of forming the gate electrode. First, the first metal film 42 is etched using the reflowed photoresist pattern 46a of FIG. 15 as a mask, after which the reflowed photoresist 46a is removed. Since the etched first metal film 42 is now wider than the second metal film 44 by the thickness of the reflowed photoresist 46a of FIG. 15, the step coverage of the insulating film is favorable in a subsequent insulating film depositing step. In order to prevent the first metal film 42 from contacting the ITO formed in a subsequent process, it is preferable to control the thickness and the size of the photoresist pattern to make the patterned second metal film 44 larger than the contact hole for connecting the ITO and the gate pad.

Figure 17:
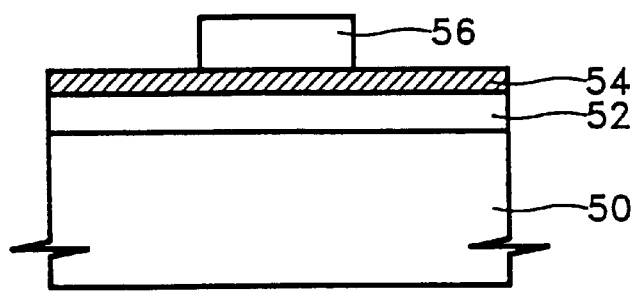
FIGS. 17 through 19 are sectional views illustrating a method for manufacturing a liquid crystal display according to a third preferred embodiment of the present invention.
Figure 18:
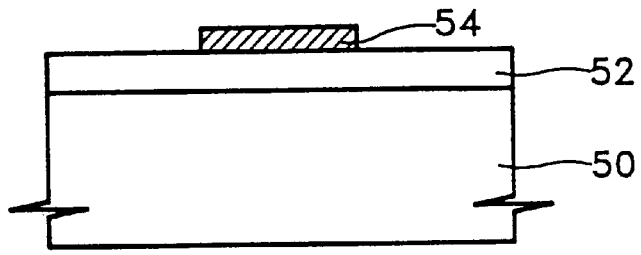
Figure 19:
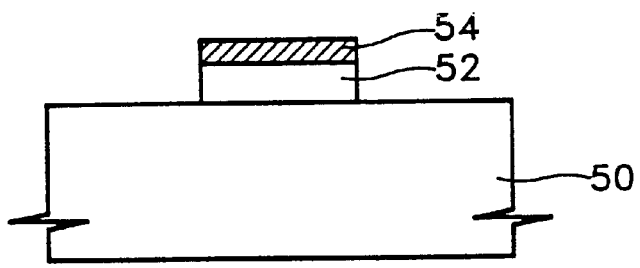

FIGS. 17 through 19 are sectional views for explaining a method for manufacturing a liquid crystal display according to a third preferred embodiment of the present invention. The initial steps of the process, through the step of forming the gate electrode, are shown. All subsequent steps are similar to those shown for the first preferred embodiment in FIGS. 8 to 11.

FIG. 17 shows the step of forming conductive films 52 and 54 for the gate electrode and a photoresist pattern 56. These steps are identical to the steps described with reference to FIG. 13 for the second preferred embodiment of the present invention.

FIG. 18 shows the step of patterning the second metal film 54. In this step, the second metal film 54 is wet or dry etched using the photoresist pattern 56 of FIG. 17 as a mask. The photoresist pattern may then be removed, or it may remain until after the first metal film 52 is etched.

If the second metal film 54 is wet etched in this step, an undercut may be generated to narrow the width of the first metal film 52. In this case, if the photoresist pattern is not removed, baking may be performed on the photoresist pattern to prevent lifting of the photoresist pattern.

FIG. 19 shows the step of forming the gate electrode by etching the first metal film 52 using the patterned second metal film 54 as a mask. If the photoresist pattern 56 is not removed in the previous step, the photoresist pattern 56 can be used as a mask and it can be removed after etching the first metal film 52.

FIGS. 20 through 23 are sectional views for explaining a method for manufacturing a liquid crystal display according to a fourth preferred embodiment of the present invention. The initial steps of the process, through the step of forming the gate electrode, are shown. All subsequent steps are similar to those shown for the first preferred embodiment in FIGS. 8 to 11.

Figure 20:
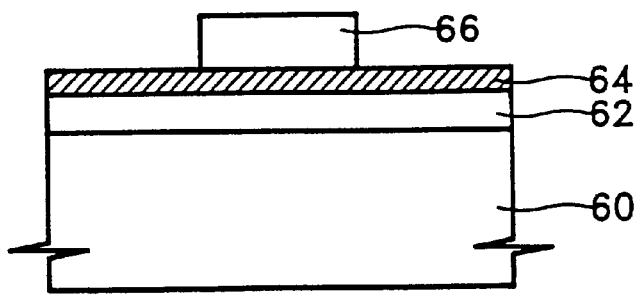
FIGS. 20 through 23 are sectional views illustrating a method for manufacturing a liquid crystal display according to a fourth preferred embodiment of the present invention.

FIG. 20 shows the steps of forming conductive films 62 and 64 for the gate electrode and a photoresist pattern 66. These steps are identical to the steps described with reference to FIG. 13 and 17 for the second and third preferred embodiments of the present invention.

Figure 21:
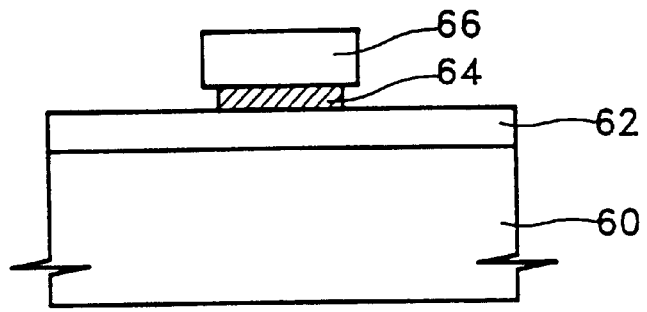

FIG. 21 shows the step of etching the second metal film, in which the second metal film 64 is wet etched using the photoresist pattern 66 as a mask. At this time, the second metal film 64 is sufficiently etched so as to generate an undercut.

Figure 22:
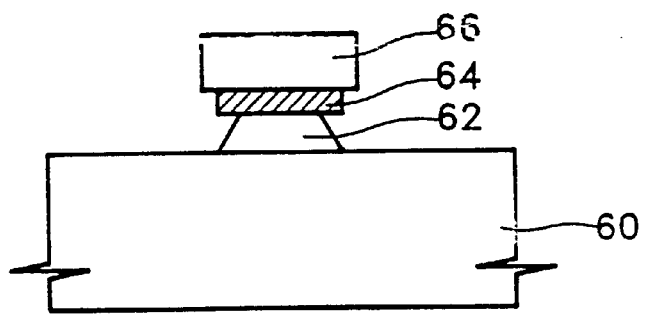

FIG. 22 shows the step of etching the first metal film 62. In this step an undercut is formed in the gate electrode as shown in FIG. 12 when the first metal film 62 is wet etched using the patterned second metal film 64 as a mask.

Figure 23:
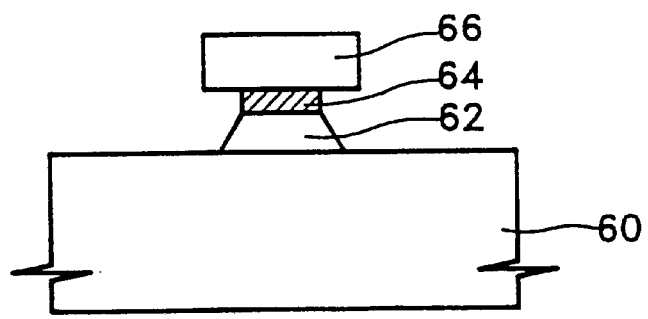

FIG. 23 shows the step of re-etching the second metal film, in which the width of the lower portion of the first metal film 62 becomes wider than that of the second metal film 64 after the patterned second metal film 64 is re-etched. As a result of this re-etching, the undercut of the gate electrode is removed. To avoid lifting of the photoresist pattern 66 when etching the first metal film 62 or when re-etching the second metal film 64, baking may be performed on the second metal film 64 after performing the first etching on the second metal film 64.

According to the above-mentioned preferred methods for manufacturing the liquid crystal display according to the present invention, the gate electrode is formed in a two-layered-structure of Al or Al-alloy and a refractory metal. Therefore, it is possible to prevent a battery effect caused by directly contacting the Al to the ITO and it is also possible to prevent the generation of a hillock of the Al due to the stress relaxation of the refractory metal. It is also possible to reduce the number of photolithography processes by omitting the anodizing process and simultaneously etching the insulating film and the protection film.

Since it is possible to form the Al film or Al-alloy film formed on the lower area to be identical in size or larger than the refractory metal formed on the upper portion, an undercut is not generated in the gate electrode. Therefore, it is possible to prevent the deterioration of insulation characteristics caused by poor step coverage.

The present invention is not limited to the above-described embodiments. Various changes and modifications may be effected by one having an ordinary skill in the art and remain within the scope of the invention, as defined by the appended claims.

What is claimed is:

1. A TFT substrate, comprising:
   a gate electrode comprising a first metal film pattern formed over a substrate and a second metal film pattern formed over the first metal film pattern;
   a gate pad comprising the first metal film and the second metal film formed over the substrate;
   an insulating layer pattern formed over the gate electrode, exposing a portion of the second metal film of the gate pad;
   a semiconductor film pattern formed over the insulating layer pattern and over the gate electrode;
   an impurity doped semiconductor film pattern formed on the semiconductor film pattern, wherein the impurity doped semiconductor film pattern contacts the top surface of the semiconductor film pattern and the impurity doped semiconductor film pattern is separated, to thereby expose a portion of the semiconductor film pattern formed over the gate electrode;
   a source electrode and a drain electrode formed over a portion of the impurity doped semiconductor film pattern;
   a protection film pattern formed over the source electrode and the drain electrode in the TFT area and over the insulating layer in a gate pad area, the protection film pattern having a contact hole over the drain electrode and exposing a top surface of the second metal film in the gate pad area;
   a first pixel electrode pattern electrically connected to the exposed area of the second film pattern; and
   a second pixel electrode pattern electrically connected to the exposed area of the second metal film in the gate pad area.

2. The TFT substrate as recited in claim 1, wherein the second metal film comprises a metal selected from the group consisting of Cr, Mo, Ta, and Ti.

3. The TFT substrate as recited in claim 2, wherein the first metal film comprises Al or an Al-alloy.

4. The TFT substrate as recited in claim 1, wherein the insulating layer comprises a nitride film with the formula, $SiN_x$.

5. The TFT substrate as recited in claim 1 wherein the first and second pixel electrode pattern comprises indium tin oxide (ITO).

6. A TFT substrate as recited in claim 1, wherein a portion of the protection film pattern directly contacts the semiconductor film pattern located between the source electrode and the drain electrode.

7. A TFT substrate as recited in claim 1, wherein a thickness of the second metal film pattern is the same or less than thickness of the first metal film pattern.

8. A TFT substrate as recited in claim 1, wherein a width of the second metal film pattern is the same or less than a width of the upper surface of the first metal film pattern.

9. A TFT substrate as recited in claim 1, wherein a width of the first metal film pattern is getting narrower from the bottom of the first metal film pattern.

10. A TFT substrate as recited in claim 1, wherein the second metal film pattern comprises a refractory metal.

11. A TFT substrate as recited in claim 10, wherein the first metal film pattern comprises Al or Al-alloy.

12. A TFT substrate, comprising:
- a gate electrode and a gate pad comprising at least one of a refractory metal film pattern formed on a transparent substrate;
- an insulating layer pattern formed over the gate electrode, exposing a portion of the gate pad;
- a semiconductor film pattern formed over the insulating layer pattern and over the gate electrode;
- an impurity doped semiconductor film pattern formed on the semiconductor film pattern, wherein the impurity doped semiconductor film pattern contacts to the top surface of the semiconductor film pattern and the impurity doped semiconductor film pattern is separated, to thereby expose a portion of the semiconductor film pattern formed over the gate electrode;
- a source electrode and a drain electrode formed over a portion of the impurity doped semiconductor film pattern;
- a protection film pattern formed over the source electrode and the drain electrode in a TFT area and over the insulating layer pattern in a gate pad area, the protection film pattern having a contact hole over the drain electrode and exposing a top surface of the gate pad;
- a first pixel electrode pattern electrically connected to the drain electrode on the protection film pattern; and
- a second pixel electrode pattern electrically connected to the exposed area of the gate pad.

13. A TFT substrate as recited in claim 12, the gate electrode and the gate pad further comprising a metal film pattern different from the refractory metal film pattern.

14. A TFT substrate as recited in claim 13, wherein the refractory metal film pattern comprises a metal selected from the group consisting Cr, Mo, Ta an Ti.

15. A TFT substrate as recited in claim 13, wherein the metal film pattern comprises Al or Al-alloy.

16. A TFT substrate as recited in claim 12, wherein the insulating layer pattern comprises a nitride film with formula, SiNx.

17. A TFT substrate as recited in claim 12, wherein the first and second pixel electrode pattern comprises indium tin oxide(ITO).

18. A TFT substrate as recited in claim 12, wherein a portion of the protection film pattern directly contacts the semiconductor film pattern located between the source electrode and the drain electrode.

19. A TFT substrate as recited in claim 13, wherein a thickness of the refractory metal film pattern is the same of less than a thickness of the metal film pattern.

20. A TFT substrate as recited in claim 13, wherein a width of the metal film pattern is the same or less than a width of the upper surface of the refractory metal film pattern.

21. A TFT substrate as recited in claim 13, wherein a width of the metal film pattern is getting narrower from the bottom of the metal film pattern.

22. A TFT substrate as recited in claim 21, wherein the metal film pattern is formed under the refractory metal film pattern.

23. A TFT substrate as recited in claim 12, wherein the semiconductor film pattern is an amorphous silicon.

* * * * *